United States Patent [19]

Arai et al.

[11] Patent Number: 4,622,271
[45] Date of Patent: Nov. 11, 1986

[54] MAGNETIC RECORDING MEDIUM

[75] Inventors: Yoshihiro Arai; Ryuji Shirahata, both of Kanagawa, Japan

[73] Assignee: Fuji Photo Film Co., Ltd., Kanagawa, Japan

[21] Appl. No.: 725,198

[22] Filed: Apr. 19, 1985

[30] Foreign Application Priority Data

Apr. 20, 1984 [JP] Japan ................................. 59-79833
Apr. 20, 1984 [JP] Japan ................................. 59-79835

[51] Int. Cl.$^4$ .......................................... H01F 10/02
[52] U.S. Cl. .................................. 428/615; 427/131; 427/132; 427/251; 427/255.7; 428/336; 428/655; 428/668; 428/675; 428/676; 428/680; 428/681; 428/694; 428/900; 428/928
[58] Field of Search ............ 427/131, 132, 251, 255.7; 428/615, 336, 655, 668, 675, 676, 680, 681, 694, 900, 928

[56] References Cited

FOREIGN PATENT DOCUMENTS 54-141111 11/1979 Japan ................................. 427/131
57-143731 9/1982 Japan ................................. 427/131
57-143730 9/1982 Japan ................................. 427/131

Primary Examiner—Bernard D. Pianalto
Attorney, Agent, or Firm—Sughrue, Mion, Zinn, Macpeak, and Seas

[57] ABSTRACT

A magnetic recording medium is described, comprising a support having provided thereon a thin magnetic metal vapor deposition film, said film being provided by evaporating a magnetic metal material from an evaporation source to generate a vapor flow and directing the vapor flow to contact a moving support at an inclined angle, and having a curved and inclined column structure formed by continuously altering the incident angle of said vapor flow on the moving support from a high degree ($\theta_{max}$) to a low degree ($\theta_{min}$), and a non-magnetic metal vapor deposition film provided on the magnetic metal film, said non-magnetic metal film being provided by continuously altering the incident angle of vapor flow of the non-magnetic metal material to the moving support on which the magnetic metal film is formed between a high degree ($\theta_{max}'$) and a low degree ($\theta_{min}'$).

18 Claims, 2 Drawing Figures

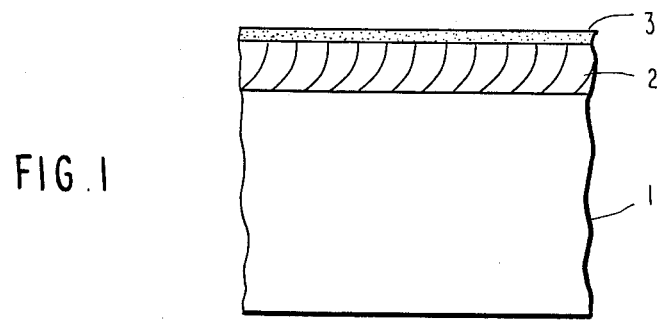
FIG.1
FIG.2
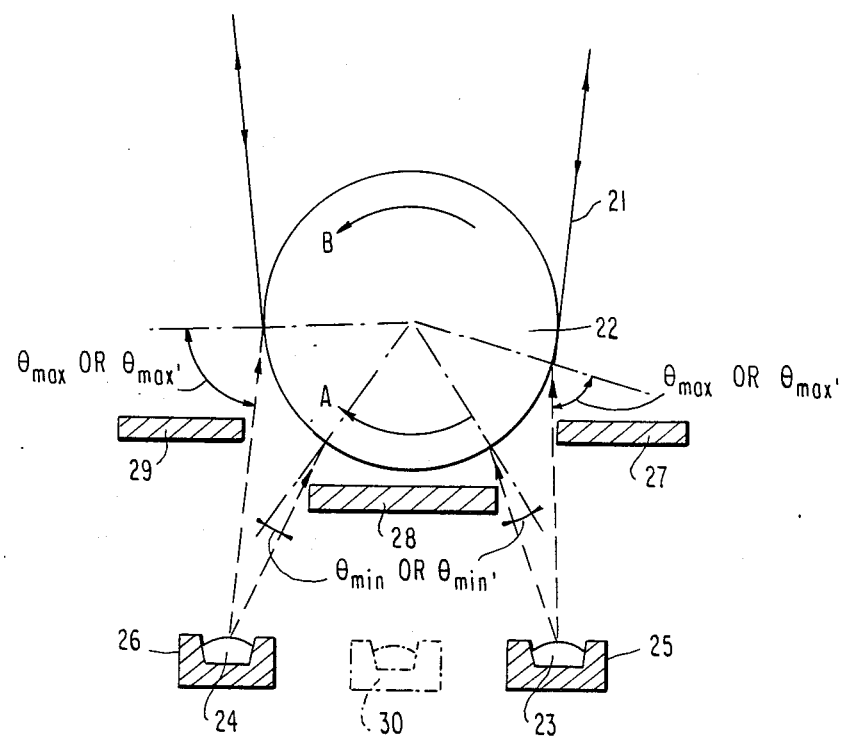

MAGNETIC RECORDING MEDIUM

FIELD OF THE INVENTION

The present invention relates to a magnetic recording medium provided as a magnetic recording layer with ferromagnetic metal thin film formed by an oblique evaporation method. More particularly, the invention relates to a magnetic recording medium excellent in weather resistance after repeated use, anti-corrosive properties, and anti-curling properties.

BACKGROUND OF THE INVENTION

In the past, a coating type of magnetic recording media has been generally employed. This type of media is generally obtained by coating on a non-magnetic support a magnetic coating composition prepared by dispersing a powdery magnetic material, e.g., a magnetic powder of an oxide such as $\gamma$-$Fe_2O_3$, Co-doped $\gamma$-$Fe_2O_3$, $Fe_3O_4$, Co-doped $Fe_3O_4$, a Berthollide compound composed of $\gamma$-$Fe_2O_3$ and $\gamma$-$Fe_3O_4$, $CrO_2$, etc., a ferromagnetic alloy powder, or so on, into an organic binder. Some conventional binders include vinyl chloride-vinyl acetate copolymer, styrene-butadiene copolymer, epoxy resin, and polyurethane resin. The coated composition is then dried to form a magnetic layer.

In recent years, there has been a demand for recording a large amount of information in a small area of recording material, which is commonly referred to as "high density recording".

With the increased demand for high density recording, there has been an increased demand for the so-called non-binder type of magnetic recording media. Such media contain no organic binders in their magnetic recording layer(s) and have as the magnetic recording layer(s) a thin film(s) of ferromagnetic metal(s) formed by the vapor deposition techniques such as vacuum evaporation, sputtering, or ion plating, or metal plating techniques such as electroplating or electroless plating. Such media have attracted the attention of the art, and various efforts for putting them to practical use have been made.

Conventional coating type magnetic recording media principally utilize metal oxides as magnetic materials. Furthermore, reduction of the thickness of such media is accompanied by a lowering of the signal output. Therefore, reduction of the thickness of the magnetic recording layer, which is necessary for increasing the recording density, is limited. In addition, they must be manufactured by complicated processes using large sized incidental equipment for recovering solvents used in the manufacturing process. Such equipment and procedures may also involve problems of environmental pollution. On the other hand, non-binder type magnetic recording media contain ferromagnetic metals, which have saturation magnetization greater than those of the above described metal oxides. Such media are in the form of a thin film which does not contain any non-magnetic substances such as a binder. Therefore, such media can have very thin magnetic films capable of high density recording. In addition, the manufacturing processes are simple.

Magnetic recording media used for high density recording must use magnetic substances having high coercive force and a reduced thickness. Such being the case, non-binder type magnetic recording media appear to be very promising because it is easy to decrease their thickness one order of magnitude below thickness of the conventional coating type magnetic recording media. Furthermore, such media possess high magnetic flux densities.

In particular, the application of vacuum evaporation techniques to the formation of magnetic recording layers is advantageous because it is not necessary to dispose of waste solutions, unlike metal plating techniques, because of the simple manufacturing process, and because the deposition speed of the magnetic metal film can be increased to a high rate. There are known processes for manufacturing a magnetic film having coercive force and squareness ratio desired for magnetic recording media by utilizing vacuum deposition processes, e.g., an oblique incident evaporation method, as disclosed in U.S. Pat. Nos. 3,342,632 and 3,342,633.

Further, magnetic recording media provided with ferromagnetic metal thin films must have high corrosive strength, abrasive strength, and running stability. The magnetic recording media and a magnetic head are in relative motion at high speed when they contact each other while recording, reproducing, and during erasing operations of magnetic signals. In such operations, smooth and stable running of the magnetic recording media must be ensured. Furthermore, wear or rupture caused by continual contact with a magnetic head must be avoided. It is also desired that there is little or no decrease or unintentional erasure of signals recorded in the magnetic recording medium with the lapse of time, for example, that caused by corrosion or rust during storage.

It has accordingly been proposed that a protective layer be provided in order to improve durability and weather resistance. For example, an organic protective layer is disclosed in U.S. Pat. Nos. 3,466,156, 4,069,360, 4,152,487, 4,152,469 and 4,333,985, German Patent Application (OLS) Nos. 2,929,847 and 3,024,918; a metal protective layer such as Rh is disclosed in U.S. Pat. Nos. 3,516,860 and 4,245,008. In addition, it is disclosed in Japanese Patent Publication No. 4393/70 that a protective layer containing Cr and chromium oxide can be provided by evaporating Cr on a ferromagnetic thin metal film in a vacuum, and it is disclosed in Japanese Patent Publication No. 37615/83 that a protective layer be provided by laminating a Cr layer and a Si-Si oxide layer. However, these protective layers are not completely sufficient because they do not provide sufficient anti-corrosive properties. When the protective layers are used on magnetic recording media, weather resistance after repeated use, for example, in a video tape recorder (VTR) is insufficient. Further, when a ferromagnetic thin metal film is formed on a flexible support by an oblique incident vapor deposition method, the ferromagnetic thin metal film tends to curl with the film on the inside by internal stress, and such curling is not improved even if a protective layer such as a Cr-protective layer is provided on the film.

SUMMARY OF THE INVENTION

An object of the invention is to provide a magnetic recording medium having excellent weather resistance, particularly having a protective layer with excellent weather resistance even after repeated use in a VTR deck.

Another object of the invention is to provide a magnetic recording medium having a protective layer with excellent anti-corrosion properties and having reduced curling tendency.

The above objects of the invention can be accomplished by evaporating a magnetic metal material from an evaporation source to generate a vapor flow and directing the vapor flow to contact a moving support while continuously altering the incident angle of said vapor flow on the moving support from a high degree ($\theta_{max}$) to a low degree ($\theta_{min}$) to provide a thin magnetic metal vapor deposition film, and by evaporating a non-magnetic metal material on the thin metal film while continuously altering the incident angle of vapor flow of the non-magnetic material to the moving support between a high degree ($\theta_{max'}$) and a low degree ($\theta_{min'}$) to provide a non-magnetic metal protective film on the thin metal film.

BRIEF DESCRIPTION OF THE DRAWINGS

FIG. 1 is a cross-sectional view of magnetic recording medium in the present invention.

FIG. 2 is an illustrative view of an apparatus for preparing a magnetic recording medium according to the present invention.

DETAILED DESCRIPTION OF THE INVENTION

Oblique evaporation according to the present invention refers to the method of supplying the vapor flow of a ferromagnetic matel material onto the surface of a support at an incident angle $\theta$ to the normal line of the surface of the support, and depositing thereon to form a magnetic thin film. Oblique evaporation is started with an incident angle of $\theta_{max}$ and the incident angle is continuously altered so as to decrease it continuously while moving the support, and then the oblique evaporation is stopped at $\theta_{min}$.

On the thus formed magnetic thin film, a non-magnetic metal material, particularly at least one of Cr, Ti, Sn, Cu and Al is evaporated while the incident angle of vapor flow of the non-magnetic metal material to the moving support is continuously altered to provide a protective film. The incident angle of vapor flow of the non-magnetic metal material can be altered from a low degree ($\theta_{min'}$) to a high degree ($\theta_{max'}$), or from a high degree ($\theta_{max'}$) to a low degree ($\theta_{min'}$).

In the invention, the incident angle ($\theta$) is preferably 25° to 90°, the maximum incident angle ($\theta_{max}$ and $\theta_{max'}$) is preferably from 50° to 90°, and the minimum incident angle ($\theta_{min}$ and $\theta_{min'}$) is from 25° to 75°.

In FIG. 1, a magnetic recording medium of the present invention is shown, which comprises a support 1 having provided thereon a magnetic metal vapor deposition film 2 and a non-magnetic metal vapor deposition film 3. The magnetic metal vapor deposition film 2 has a curved and inclined column structure which is obtained by supplying a vapor flow of magnetic metal onto the support moving in the direction of arrow A while continuously altering an incident angle from $\theta_{max}$ to $\theta_{min}$. The thickness of the magnetic metal vapor deposition film 2 is desirably larger to provide sufficient output and desirably smaller for high density recording. Generally, the thickness is from about 0.02 μm to 5.0 μm, and preferably the thickness is from 0.05 μm to 2.0 μm. The non-magnetic metal vapor deposition film 3 can be formed by depositing a vapor flow of the non-magnetic metal, which is preferably selected from Cr, Ti, Sn, Cu, Al, and mixtures thereof, on the moving support (with the magnetic film deposited thereon) while continuously altering the incident angle of the vapor flow from $\theta_{min'}$ to $\theta_{max'}$ or from $\theta_{max'}$ to $\theta_{min'}$. The thickness of the non-magnetic metal vapor deposition film 3 should be determined to provide sufficient protecting action to the magnetic metal film but to avoid output loss due to spacing between the magnetic metal film 2 and a magnetic head. The thickness is generally from about 0.005 μm to 0.1 μm, and preferably from 0.005 μm to 0.02 μm.

Specific examples of magnetic metal materials which can be employed in the present invention include metals such as Fe, Co, and Ni, and ferromagnetic alloys such as Fe-Co, Fe-Ni, Co-Ni, Fe-Co-Ni, Fe-Rh, Fe-Cu, Co-Cu, Co-Au, Co-Y, Co-La, Co-Pr, Co-Gd, Co-Sm, Co-Pt, Ni-Cu, Mn-Bi, Mn-Sb, Mn-Al, Fe-Cr, Co-Cr, Ni-Cr, Fe-Co-Cr, Ni-Co-Cr, and Fe-Co-Ni-Cr. Particularly preferable magnetic metal materials are Co and alloys containing 70 wt % or more of cobalt. The magnetic metal vapor deposition film can be formed in atmosphere containing a reactive gas such as oxygen. When the vapor deposition is carried out in the presence of oxygen, coercive force (Hc) of the resulting magnetic metal film can be increased while the coercive force is generally decreased as the incident angle in the oblique evaporation decreases. Therefore, the vapor deposition in the presence of oxygen makes it possible to deposit magnetic metal at an incident angle smaller than that in the absence of oxygen so that efficiency of vapor deposition is improved. However, since saturation magnetization ($\sigma_s$) tends to be decreased by the presence of oxygen, an amount of oxygen introduced should be determined taking the above effects into account.

Evaporation methods which can be employed in the present invention include not only a conventional vacuum deposition method as disclosed in U.S. Pat. No. 3,342,632, but also any method known for forming thin films on a support in an atmosphere of evaporated molecules having a mean free path elongated by ionizing or accelerating the vapor flow by application of an electric field or a magnetic field thereacross, or by irradiation with electron beams. For example, an electric field vapor deposition method is disclosed in U.S. Pat. No. 4,354,908, and the ionizing vapor deposition methods are disclosed in U.S. Pat. Nos. 3,406,040 and 3,573,981, Japanese Patent Publication Nos. 20484/71 and 26579/72, and Japanese Patent Application (OPI) Nos. 33890/74, 34483/74 and 535/74 (the term "OPI" as used herein refers to a "published unexamined Japanese patent application").

The support in the present invention can include plastic films or foils such as polyethylene terephthalate, polyimide, polyamide, polyvinyl chloride, cellulose triacetate, polycarbonate, or polyethylene naphthalate.

In the magnetic recording medium of the present invention, a lubricating layer and/or a backing layer can be provided, if desired. The backing layer is provided on a back surface of the support. Further, a layer containing an organic or inorganic substance can be provided between the magnetic metal vapor deposition film and the support. These are described in U.S. Pat. No. 4,414,270.

The invention is explained in more detail by the following examples, but it is to be understood that the present invention is not limited to the examples.

EXAMPLE 1

A cobalt vapor deposition magnetic thin film was formed on a polyethylene terephthalate film having a thickness of 12.5 μm by oblique vapor deposition method using a winding vapor deposition apparatus shown in FIG. 2 to provide a magnetic tape. The magnetic vapor deposition film and the non-magnetic vapor deposition film were formed on a web (a belt-shaped support) 21 moving on a cooling can (a cooling roll) 22 in FIG. 2 by the oblique incident vapor deposition film. The materials for vapor deposition 23 and 24 were charged in evaporation boats 25 and 26, and were evaporated by suitable heating means (e.g., Pierce type electron beam heater). The incident angle of vapor flow to the web 21 was controlled by plates (masking shields) 27, 28 and 29. In this Example, the vapor deposited magnetic film was formed by evaporating cobalt from an evaporation boat 25 onto a polyethylene terephthalate film moving in the direction of arrow A so that the maximum incident angle ($\theta_{max}$) of cobalt vapor flow was 90° and the minimum incident angle ($\theta_{min}$) was 55°. The determination of $\theta_{max}$ and $\theta_{min}$ was carried out by the position of plates 27 and 28, respectively.

Further, the non-magnetic vapor deposition film was formed by evaporating Cr, Ti or Sn (i.e., three samples prepared) from an evaporation boat 25 on a polyethylene terephthalate film moving in the direction of arrow B. The incident angles $\theta_{min}'$ and $\theta_{max}'$ which were determined by the position of plates 27 and 28 were 40° and 90°, respectively. The thickness of the magnetic vapor deposition film was 1,000 Å, and the thickness of the non-magnetic vapor deposition film was 130 Å.

COMPARATIVE EXAMPLE 1

The same procedure as in Example 1 was repeated except that a Cr, Ti or Sn film was provided by a conventional vacuum vapor deposition method on the cobalt vapor deposition magnetic thin film provided on a polyethylene terephthalate film. That is, the vapor flow of Cr, Ti or Sn was supplied from an evaporation boat 30 which was installed under the cooling can 22 onto the polyethylene terephthalate film moving in the direction of arrow A without the presence of plate 28 to form a Cr, Ti or Sn film.

Weather resistance of the thus obtained magnetic tapes after repeated use was measured. That is, the magnetic tapes were allowed to stand over a period of one week at 80° C. and 90% relative humidity after 50 runs in a VHS type VTR, and then anti-corrosive property on the surface of the magnetic tapes and the adhesive property of the vapor deposition films were measured. The adhesive property was conducted by an adhesive tape peeling test. That is, the adhesive property of vapor deposition film was examined by adhering a polyethylene terephthalate adhesive tape to the film and peeling off the adhesive tape at an angle of 180°. The thus conducted tests were evaluated by five grades, with 5 indicating the most favorable characteristics, and the evaluation of the anti-corrosive property and the adhesive property are shown below.

Five Grade Evaluation of Anti-Corrosive Property:
1. Rust is observed remarkably with naked eye.
2. Rust is observed with naked eye.
3. Rust is hardly observed with naked eye.
4. Rust is observed with a microscope (×50).
5. Rust is not observed with a microscope (×50).

Five Grade Evaluation of Adhesive Property:
1. The vapor deposition films are peeled apart completely.
2. 75% of the vapor deposition films are peeled apart.
3. 50% of the vapor deposition films are peeled apart.
4. 25% of the vapor deposition films are peeled apart.
5. The vapor deposition films are not peeled apart at all.

The results are shown in Table 1 below.

TABLE 1

| Sample | | Anti-Corrosive Property | Adhesive Property of Vapor Deposition Film |
|---|---|---|---|
| Example No. | Non-Magnetic Thin Film | | |
| Example 1 | Cr | 5 | 5 |
| | Ti | 4 | 5 |
| | Sn | 5 | 5 |
| Comparative Example 1 | Cr | 3 | 3 |
| | Ti | 2 | 3 |
| | Sn | 2 | 4 |

EXAMPLE 2

A magnetic vapor deposited thin film of Co-Ni (nickel content: 25 wt %) having a thickness of 1,300 Å was provided by evaporating Co-Ni from an evaporation boat 25 on a polyethylene terephthalate film having a thickness of 9.5 μm according to an oblique incident evaporation method using a winding type evaporation apparatus shown in FIG. 2. The polyethylene terephthalate film was continuously moved in the direction of arrow A and the incident angle of the magnetic metal was continuously altered from 86° ($\theta_{max}$) to 40° ($\theta_{min}$) in an atmosphere of oxygen gas.

On the magnetic thin film moved in the direction of arrow A, a non-magnetic metal vapor deposited film of Cr, Cu or Al having a thickness of 200 Å was provided by evaporating Cr, Cu or Al from an evaporation boat 26 while altering the incident angle of vapor flow determined by the position of plates 28 and 29 from 50° ($\theta_{min}'$) to 90° ($\theta_{max}'$).

COMPARATIVE EXAMPLE 2

The same procedure as in Example 2 was repeated except that the non-magnetic metal thin film of Cr, Cu or Al having a thickness of 200 Å was provided by a conventional vacuum vapor deposition method analogous to that of Comparative Example 1.

Weather resistance of the thus prepared magnetic tapes after repeated use was measured in the same manner as in Example 1 and Comparative Example 1. The results are shown in Table 2.

TABLE 2

| Sample | | Anti-Corrosive Property | Adhesive Property of Vapor Deposition Film |
|---|---|---|---|
| Example No. | Non-Magnetic Thin Film | | |
| Example 2 | Cr | 5 | 5 |
| | Cu | 5 | 5 |
| | Al | 4 | 5 |
| Comparative Example 2 | Cr | 3 | 4 |
| | Cu | 3 | 3 |
| | Al | 3 | 2 |

As is apparent from Tables 1 and 2, magnetic recording media of the present invention have improved weather resistance after repeated use.

EXAMPLE 3

The same procedure as in Example 1 was repeated, except that the non-magnetic metal film was formed while the polyethylene terephthalate film was continuously moved in the direction of arrow A after the polyethylene terephthalate film was vapor deposited with the magnetic metal film, and was rewound in the direction of arrow B, namely, the non-magnetic metal film was formed by evaporating Cr, Ti or Sn from an evaporation boat 25 while altering the incident angle of vapor flow determined by the position of plates 27 and 28 from 90° ($\theta_{max'}$) to 40° ($\theta_{min'}$).

Anti-corrosive property and the curling property of the thus obtained magnetic tapes were measured. Anti-corrosive property was tested by five grade evaluation of generated rust state after storage of 24 hours at temperatures ranging from 30° C. to 60° C. for each 1 hour by using a water drop generating type weather tester (trademark: "E-12 WG", manufactured by Yamazaki Seiki Research Laboratories, Co., Ltd.). The evaluation of the anti-corrosive property is the same as described above. Curling value 10/γ was calculated based on a curvature "γ" radius of curling in the transverse direction of magnetic tapes.

The results are shown in Table 3, with those of the magnetic tape prepared in Comparative Example 1.

TABLE 3

| Example No. | Sample Non-Magnetic Thin Film | Anti-Corrosive Property | Curling Property (curling value) |
|---|---|---|---|
| Example 3 | Cr | 5 | 1 |
|  | Ti | 4 | 0 |
|  | Sn | 4 | 1 |
| Comparative Example 1 | Cr | 4 | 10 |
|  | Ti | 2 | 9 |
|  | Sn | 2 | 9 |

EXAMPLE 4

The same procedure as in Example 2 was repeated, except that a non-magnetic metal film was provide while the polyethylene terephthalate film was moved in the direction of arrow B after the magnetic metal thin film was formed, namely, by evaporating Cr, Cu or Al from an evaporation boat 26 while altering the incident angle of vapor flow from 90° ($\theta_{max'}$) to 50° ($\theta_{min'}$).

Anti-corrosive property and curling property were measured by the same manner as Example 3. The results are shown in Table 4, with those of the magnetic tape prepared in Comparative Example 2.

TABLE 4

| Example No. | Sample Non-Magnetic Thin Film | Anti-corrosive Property | Curling Property (curling value) |
|---|---|---|---|
| Example 4 | Cr | 5 | 1 |
|  | Cu | 5 | 2 |
|  | Al | 4 | 1 |
| Comparative Example 2 | Cr | 4 | 15 |
|  | Cu | 3 | 18 |
|  | Al | 2 | 12 |

As is apparent from Tables 3 and 4, magnetic recording media of the present invention having improved anti-corrosive property and less curling tendencies are obtained.

While the invention has been described in detail and with rererence to specific embodiments thereof, it will be apparent to one skilled in the art that various changes and modifications can be made therein without departing from the spirit and scope thereof.

What is claimed is:

1. A magnetic recording medium comprising a support having provided thereon a thin magnetic metal vapor deposition film, said film being provided by evaporating a magnetic metal material from an evaporation source to generate a vapor flow and directing the vapor flow to contact a moving support at an inclined angle, and having a curved and inclined column structure formed by continuously altering the incident angle of said vapor flow on the moving support from a high degree ($\theta_{max}$) to a low degree ($\theta_{min}$), and a non-magnetic metal vapor deposition film provided on the magnetic metal film, said non-magnetic metal film being provided by continuously altering the incident angle of vapor flow of the non-magnetic metal material to the moving support on which the magnetic metal film is formed between a high degree ($\theta_{max'}$) and a low degree ($\theta_{min'}$).

2. A magnetic recording medium as in claim 1, wherein the incident angle of vapor flow forming the non-magnetic metal film is continuously altered from a low degree to a high degree.

3. A magnetic recording medium as in claim 1, wherein the incident angle of vapor flow forming the non-magnetic metal film is continuously altered from a high degree to a low degree.

4. A magnetic recording medium as in claim 1, wherein the non-magnetic metal material comprises at least one of Cr, Ti, Sn, Cu and Al.

5. A magnetic recording medium as in claim 1, wherein the incident angle of vapor flow of the non-magnetic metal material is from 25° to 90°.

6. A magnetic recording medium as in claim 1, wherein the maximum incident angles ($\theta_{max}$ and $\theta_{max'}$) are each from 50° to 90°, and the minimum incident angles ($\theta_{min}$ and $\theta_{min'}$) are each from 25° to 70°.

7. A magnetic recording medium as in claim 2, wherein the maximum incident angles ($\theta_{max}$ and $\theta_{max'}$) are each from 50° to 90°, and the minimum incident angles ($\theta_{min}$ and $\theta_{min'}$) are each from 25° to 75°.

8. A magnetic recording medium as in claim 3, wherein the maximum incident angles ($\theta_{max}$ and $\theta_{max'}$) are each from 50° to 90°, and the minimum incident angles ($\theta_{min}$ and $\theta_{min'}$) are each from 25° to 75°.

9. A magnetic recording medium as in claim 4, wherein the maximum incident angles ($\theta_{max}$ and $\theta_{max'}$) are each from 50° to 90°, and the minimum incident angles ($\theta_{min}$ and $\theta_{min'}$) are each from 25° to 75°.

10. A magnetic recording medium as in claim 1, wherein the thickness of the magnetic metal vapor deposition film is from 0.05 μm to 2.0 μm, and the thickness of the non-magnetic metal vapor deposition film is from 0.005 μm to 0.02 μm.

11. A magnetic recording medium as in claim 2, wherein the thickness of the magnetic metal vapor deposition film is from 0.05 μm to 2.0 μm, and the thickness of the non-magnetic metal vapor deposition film is from 0.005 μm to 0.02 μm.

12. A magnetic recording medium as in claim 3, wherein the thickness of the magnetic metal vapor deposition film is from 0.05 μm to 2.0 μm, and the thickness of the non-magnetic metal vapor deposition film is from 0.005 μm to 0.02 μm.

13. A magnetic recording medium as in claim 4, wherein the thickness of the magnetic metal vapor deposition film is from 0.05 μm to 2.0 μm, and the thickness of the non-magnetic metal vapor deposition film is from 0.005 μm to 0.02 μm.

14. A magnetic recording medium as in claim 5, wherein the thickness of the magnetic metal vapor deposition film is from 0.05 μm to 2.0 μm, and the thickness of the non-magnetic metal vapor deposition film is from 0.005 μm to 0.02 μm.

15. A magnetic recording medium as in claim 6, wherein the thickness of the magnetic metal vapor deposition film is from 0.05 μm to 2.0 μm, and the thickness of the non-magnetic metal vapor deposition film is from 0.005 μm to 0.02 μm.

16. A magnetic recording medium as in claim 7, wherein the thickness of the magnetic metal vapor deposition film is from 0.05 μm to 2.0 μm, and the thickness of the non-magnetic metal vapor deposition film is from 0.005 μm to 0.02 μm.

17. A magnetic recording medium as in claim 8, wherein the thickness of the magnetic metal vapor deposition film is from 0.05 μm to 2.0 μm, and the thickness of the non-magnetic metal vapor deposition film is from 0.005 μm to 0.02 μm.

18. A magnetic recording medium as in claim 2, wherein the non-magnetic metal material comprises at least one of Cr, Ti, Sn, Cu and Al.

* * * * *